United States Patent [19]

Kokawa et al.

[11] Patent Number: 5,381,032
[45] Date of Patent: Jan. 10, 1995

[54] SEMICONDUCTOR DEVICE HAVING A GATE ELECTRODE OF POLYCRYSTAL LAYER AND A METHOD OF MANUFACTURING THEREOF

[75] Inventors: Yoshiko Kokawa; Tohru Koyama; Kenji Kusakabe; Katsuhiko Tamura; Yasuna Nakamura, all of Hyogo, Japan

[73] Assignee: Mitsubishi Denki Kabushiki Kaisha, Tokyo, Japan

[21] Appl. No.: 111,964

[22] Filed: Aug. 26, 1993

Related U.S. Application Data

[63] Continuation of Ser. No. 789,711, Nov. 8, 1991, abandoned.

[30] Foreign Application Priority Data

Nov. 19, 1990 [JP] Japan .................... 2-314542

[51] Int. Cl.$^6$ ............... H01L 29/76; H01L 29/04; H01L 23/48; H01L 23/52
[52] U.S. Cl. ..................... 257/412; 257/627; 257/741; 257/756
[58] Field of Search ......... 357/23.1, 59 K, 60; 437/193; 257/412, 627, 741, 756

[56] References Cited

U.S. PATENT DOCUMENTS

| | | | |
|---|---|---|---|
| 4,808,555 | 2/1989 | Mauntel et al. | 357/71 |
| 5,177,569 | 1/1993 | Koyama et al. | 257/412 |

FOREIGN PATENT DOCUMENTS

| | | | |
|---|---|---|---|
| 5932170 | 2/1986 | Japan | 357/60 |
| 61-174758 | 8/1986 | Japan | 357/60 |
| 62-76677 | 4/1987 | Japan | 357/23.1 |
| 62-179766 | 8/1987 | Japan | 357/60 |
| 63-48865 | 3/1988 | Japan | 357/23.1 |
| 2-87575 | 3/1990 | Japan | 357/60 |
| 2-140933 | 5/1990 | Japan | 357/60 |

OTHER PUBLICATIONS

English Language Translation of Japanese Unexamined Patent Application No. 59-32170 (Sakurai) by U.S. Patent and Trademark Office, May, 1993.
Webster's II, New Riverside University Dictionary, 1984, p. 524.
*MOS LSI Manufacturing Technology*, Nikkei McGraw-Hill, pp. 89–91, 1985.
Appl. Phys. Lett. 36(6), 15 Mar. 1980, pp. 447–449, "Channeling of Implanted Phosphorus Through Polycrystalline Silicon" by Seidel.

*Primary Examiner*—Steven Ho Yin Loke
*Attorney, Agent, or Firm*—Lowe, Price, LeBlanc & Becker

[57] ABSTRACT

A semiconductor device without erroneous operation and deterioration of characteristics in a transistor even when an impurity region is formed in self-alignment by ion implantation using a gate electrode as a mask, and a method of manufacturing thereof are disclosed. This semiconductor device includes a gate electrode formed of a polycrystal silicon layer 4b having the crystal orientation of the crystal grains arranged in a definite orientation. By implanting ions at a predetermined angle with respect to the crystallographic axis of the crystal grains of the polycrystal silicon layer 4b in forming a p+impurity region 5 by ion implantation using the gate electrode as a mask, the channeling phenomenon where ions pass through the gate electrode is prevented. Therefore, generation of erroneous operation and deterioration of characteristics in a transistor are prevented in forming an impurity region in self-alignment by ion implantation using the gate electrode as a mask.

1 Claim, 11 Drawing Sheets

SEMICONDUCTOR DEVICE HAVING A GATE ELECTRODE OF POLYCRYSTAL LAYER AND A METHOD OF MANUFACTURING THEREOF

This application is a continuation of application Ser. No. 07/789,711 filed Nov. 8, 1991, now abandoned.

BACKGROUND OF THE INVENTION

1. Field of the Invention

The present invention relates to semiconductor devices, and more particularly, to a semiconductor device having an impurity region formed by ion implantation with a gate electrode as a mask, and a method of manufacturing thereof.

2. Description of the Background Art

Figure 7:
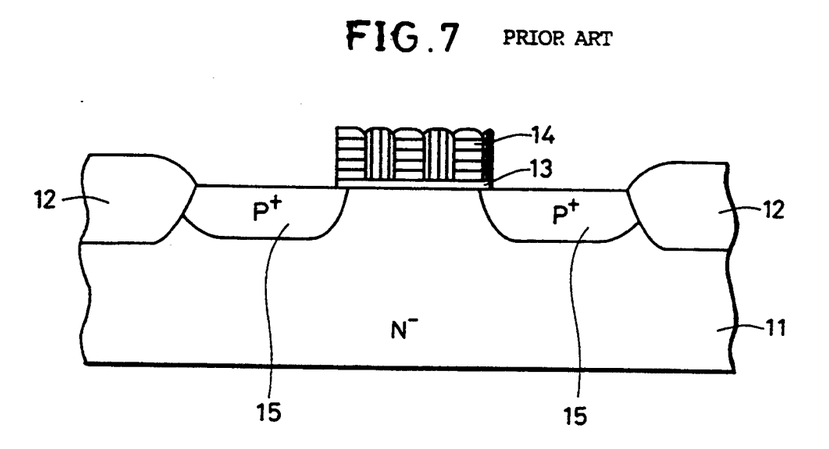
FIG. 7 is a sectional view of a conventional P channel MOS transistor having a gate electrode.

An MOS transistor is well known as one type of a semiconductor device. FIG. 7 is a sectional view of a conventional P channel MOS transistor comprising a gate electrode. Referring to FIG. 7, a P channel MOS transistor comprises an N type silicon substrate 11, element isolation oxide films 12 formed on N type silicon substrate 11 with a predetermined distance therebetween for element isolation, p+impurity regions 15 with a predetermined distance therebetween formed between element isolation oxide film 12, and a polycrystal silicon layer 14 forming a gate electrode provided between p+impurity regions 15 with a gate oxide film 13 thereunder. A conventional P channel MOS transistor has a gate electrode formed by polycrystal silicon layer 14.

Figure 8:
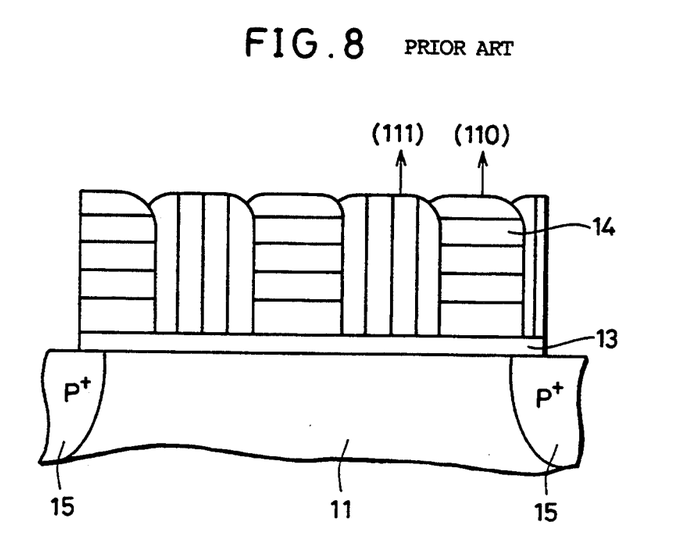
FIG. 8 is an enlarged sectional view of the gate electrodes of FIG. 7 for explaining the crystal structure.

FIG. 8 is an enlarged sectional view of the gate electrode of FIG. 7 for explaining the crystal structure. Referring to FIG. 8, polycrystal silicon layer 14 forming a conventional gate electrode has the crystal orientation of the crystal grains arranged in a plurality of plane orientations. That is to say, polycrystal silicon layer 14 has crystal grains of (110) plane orientation and crystal grains of (111) plane orientation in the example of FIG. 8. Polycrystal silicon layer 14 is doped with phosphorus.

Figure 9A:
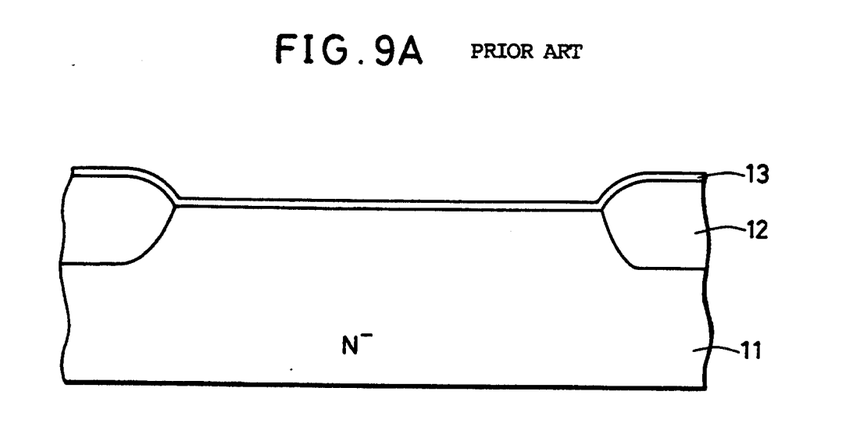
FIGS. 9A–9D are sectional views of a conventional P channel MOS transistor for explaining the manufacturing step thereof.
Figure 9B:
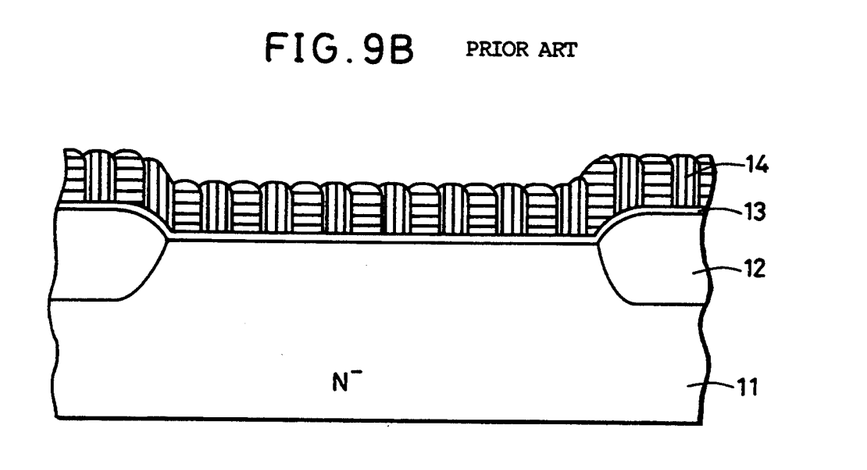
Figure 9C:
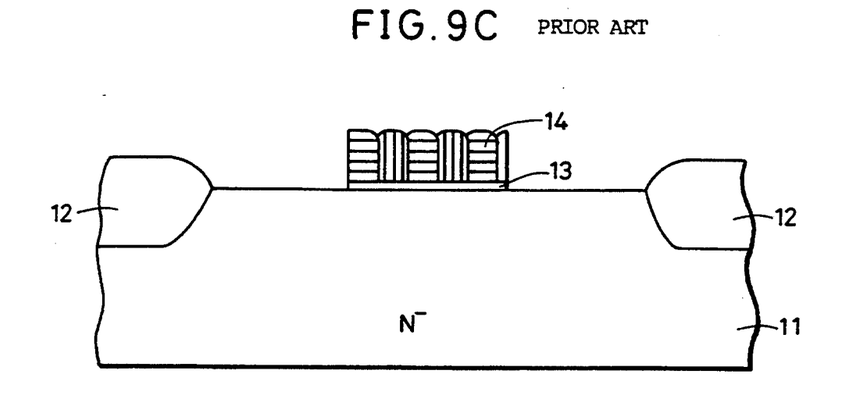
Figure 9D:
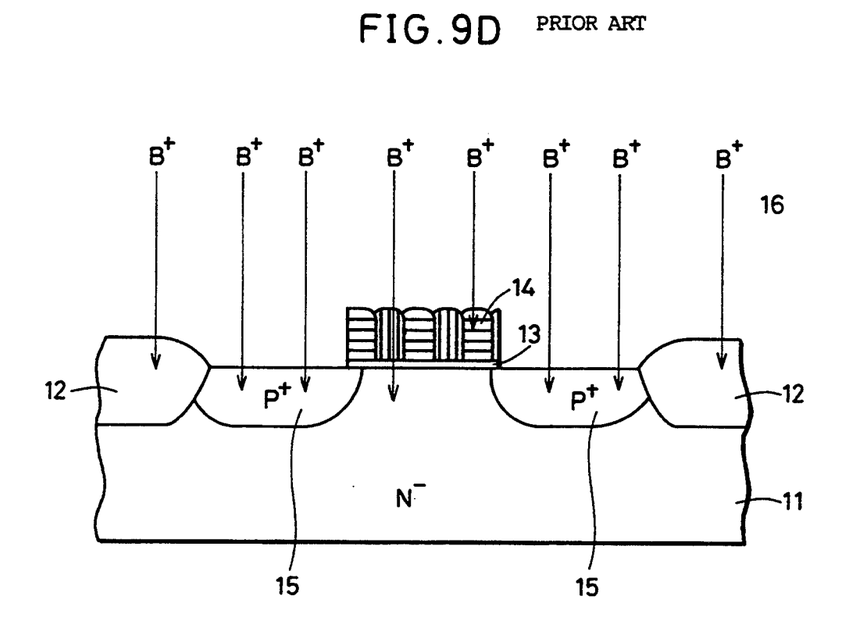

FIGS. 9A–9D are sectional views of a conventional P channel MOS transistor for explaining the manufacturing process thereof. Referring to FIG. 9A, element isolation oxide films 12 are formed on an N type silicon substrate 11 with a predetermined distance therebetween for element isolation. A gate oxide film 13 is formed on N type silicon substrate 11 and element isolation oxide films 12. Referring to FIG. 9B, a polycrystal silicon layer 14 having phosphorus doped is formed on gate oxide film 13. Polycrystal silicon layer 14 serves as a gate electrode. This polycrystal silicon layer 14 is formed of crystal grains having different plane orientations, as described above. Referring to FIG. 9C, gate oxide film 13 and polycrystal silicon layer 14 are patterned by etching using a resist pattern (not shown). Thus, a gate electrode having the structure of the present embodiment is obtained. Referring to FIG. 9D, B+ions 16 are implanted to form p+impurity regions 15, using polycrystal 0 silicon layer 14 as a mask. A conventional P channel MOS transistor is formed according to the above described manufacturing process. Polycrystal silicon layer 14 eventually is formed of crystal grains having two crystal orientations of (110) and (111) plane orientations, as described above.

In a conventional P channel MOS transistor, p+impurity regions 15 are formed in self-alignment by implanting B+ions using polycrystal silicon layer 14 which becomes a gate electrode as a mask.

Because the above described polycrystal silicon layer 14 is formed of crystal grains having crystal orientations different from each other, there was a problem that B+ions pass through polycrystal silicon layer 14 if the crystal orientation is identical to the implantation angle of the ions. This problem is called a channeling phenomenon. The implantation of B+ions right beneath the gate electrode due to channeling phenomenon induces problems that will be explained hereinafter. The channel region between p+impurity regions 15 serving as the source/drain is likely to become conductive (channel leak) which is adverse to the proper operation. The generation of channel leak induces a problem that leak current and erroneous operation are increased of the entire semiconductor device. There was also a problem that the threshold voltage rises concerning the transistor characteristic of the P channel MOS transistor.

A conventional P channel MOS transistor had a difficulty in preventing effectively generation of erroneous operation and deterioration of the characteristic of a transistor, in the case where an impurity region is formed in self-alignment by ion implantation using a gate electrode as a mask.

SUMMARY OF THE INVENTION

An object of the present invention is to prevent deterioration of transistor characteristic in a semiconductor device having an impurity region formed in self-alignment by ion implantation using a gate electrode as a mask.

Another object of the present invention is to prevent generation of channel leak (conductive state) of a transistor in a semiconductor device having an impurity region formed in self-alignment by ion implantation using a gate electrode as a mask.

A further object of the present invention is to prevent effectively channeling phenomenon where ions pass through to a channel region right beneath a gate electrode, in forming an impurity region in self-alignment by ion implantation using a gate electrode as a mask in a method of manufacturing a semiconductor device.

A still further object of the present invention is to prevent ions from passing through right beneath a gate electrode without complicating the manufacturing process, in forming an impurity region in self-alignment by ion implantation using a gate electrode as a mask in a method of manufacturing a semiconductor.

Yet another object of the present invention is to form a polycrystal silicon layer having the crystal orientation of the crystal grains arranged in a definite direction without complicating the process in a method of manufacturing a polycrystal silicon layer.

According to an aspect of the present invention, a semiconductor device includes a semiconductor substrate of a first conductivity type, a pair of impurity regions having a second conductivity type, and a gate electrode of a polycrystal layer having the crystal orientation of the crystal grains arranged in a definite orientation. The pair of impurity regions is formed on the semiconductor substrate of the first conductivity type with a predetermined distance therebetween. The gate electrode is formed with an insulating film thereunder between the pair of impurity regions on the semiconductor substrate.

In operation, the gate electrode is formed on a semiconductor substrate between the pair of impurity regions with an insulating film thereunder. The gate electrode is formed of a polycrystal layer having the crystal orientation of the crystal grains arranged in a definite orientation. By implanting ions at a predetermined angle with respect to the crystal orientation of the polycrystal layer, the channeling phenomenon where ions locally pass through the gate electrode to be implanted right beneath the gate electrode is prevented effectively.

According to another aspect of the present invention, a method of manufacturing a semiconductor device includes the step of forming a polycrystal layer on a semiconductor substrate so that the crystal orientation of the crystal grains is arranged in a definite orientation. Then, the polycrystal layer is patterned. Using the patterned polycrystal layer as a mask, an impurity region is formed on the semiconductor substrate by implanting ions at a predetermined angle with respect to the crystal orientation of the polycrystal layer.

In operation, the polycrystal layer is formed on the semiconductor substrate so that the crystal orientation of the crystal grains is arranged in a definite orientation. Using the patterned polycrystal layer as a mask, an impurity region is formed on the semiconductor substrate by implanting ions at a predetermined angle with respect to the crystal orientation of the polycrystal layer. This effectively prevents the channeling phenomenon where ions locally pass through the gate electrode to be implanted right beneath the gate electrode at the time of ion implantation. A polycrystal silicon layer having the crystal orientation arranged in a definite direction can be formed with the same number of process steps.

According to a further aspect of the present invention, a method of manufacturing a polycrystal silicon layer comprises the steps of forming a polycrystal silicon layer on an underlying substrate having the crystal orientation of the crystal grains arranged in a definite orientation by chemical vapor deposition method using silane type gas as reaction gas under the conditions of atmospheric pressure of 0.1–1.0 Torr and atmospheric temperature of 550°C.–620° C.

In operation, a polycrystal silicon layer is formed on the underlying substrate so that the crystal orientation of the crystal grains is arranged in a definite orientation, by chemical vapor deposition using silane type gas as reaction gas under the conditions of atmospheric pressure of 0.1–1.0 Torr and atmospheric temperature of 550°C.–620° C. Thus, a polycrystal silicon layer having the crystal orientation arranged in a definite direction is easily formed without complicated manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be explained hereinafter with reference to the drawings.

Figure 1:
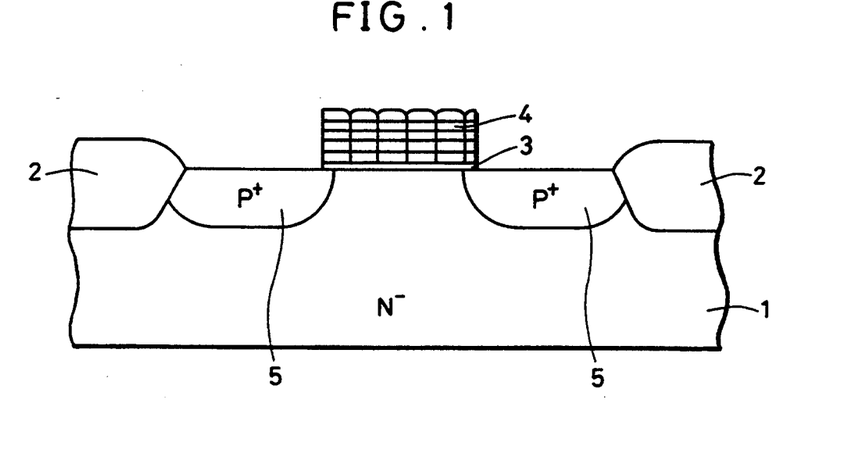
FIG. 1 is a sectional view of a P channel MOS transistor having a gate electrode according to an embodiment of the present invention.

Referring to FIG. 1, a P channel MOS transistor of the present embodiment comprises an N type silicon substrate 1, element isolation oxide films 2 on N type silicon substrate 1 with a predetermined distance therebetween for element isolation, a pair of p+impurity regions 5 with a predetermined distance therebetween between element isolation oxide films 2, and a polycrystal silicon layer 4 with a gate oxide film 3 thereunder between the pair of p+impurity region 5. Polycrystal silicon layer 4 is different from a conventional one in that the crystal orientation is arranged in a definite direction.

Figure 2:
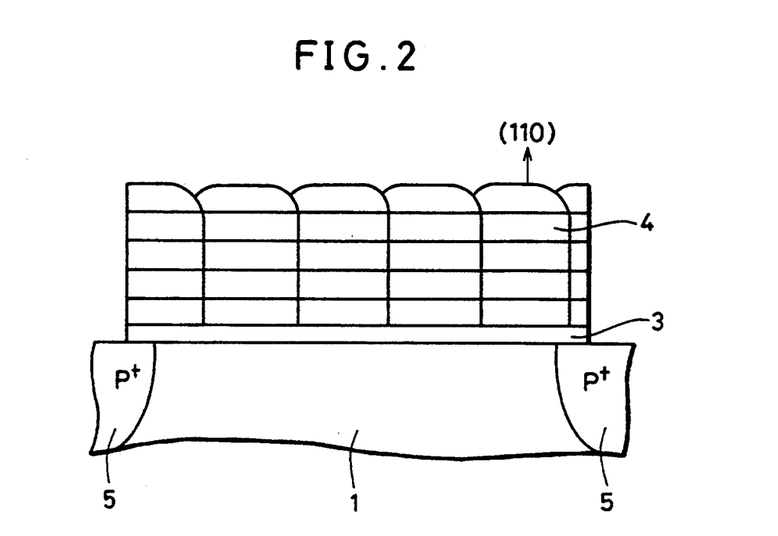
FIG. 2 is an enlarged sectional view of the gate electrode of FIG. 1 for explaining the crystal structure.

Referring to FIG. 2, polycrystal silicon layer 4 forming a gate electrode comprises crystal grains having the crystal orientation arranged in the plane orientation of (110). The present embodiment in which polycrystal silicon layer 4 serving as the gate electrode with the crystal orientation arranged in a definite direction can prevent the conventional problem of channeling phenomenon effectively. That is to say, polycrystal silicon layer 4 of the present embodiment has the crystal orientation arranged in a plane orientation of (110). By establishing the ion implantation angle tilted to a predetermined angle with respect to the crystallographic axis direction of polycrystal silicon layer 4, the inclination of the ion implantation angle with respect to the crystallographic axis becomes equal for the entire polycrystal silicon layer 4, in the formation of p+impurity region 5 described afterwards. By implanting ions at an angle with respect to the crystal orientation that is difficult to have ions implanted where the orientation is arranged in a definite crystal orientation, channelling phenomenon can be easily prevented. Accordingly, the generation of channeling between the p+impurity regions (conductive state) can be prevented effectively. Also, deterioration of transistor characteristic such as the rise of threshold voltage can also be prevented effectively.

Figure 3A:
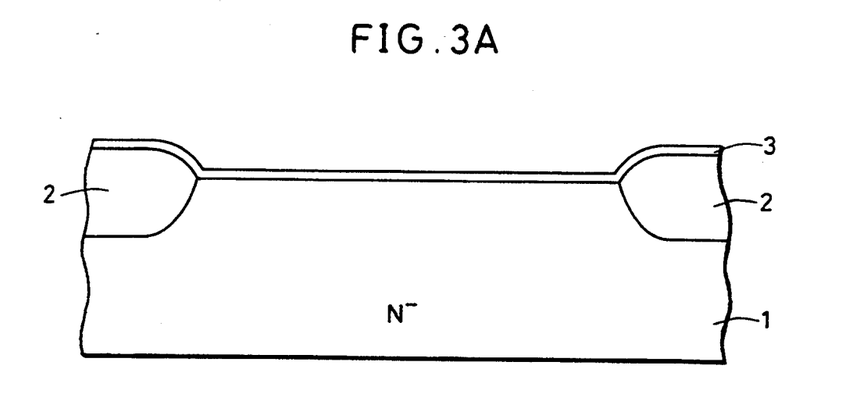
FIGS. 3A–3D are sectional views of the P channel MOS transistor of FIG. 1 for explaining the manufacturing process thereof.
Figure 3B:
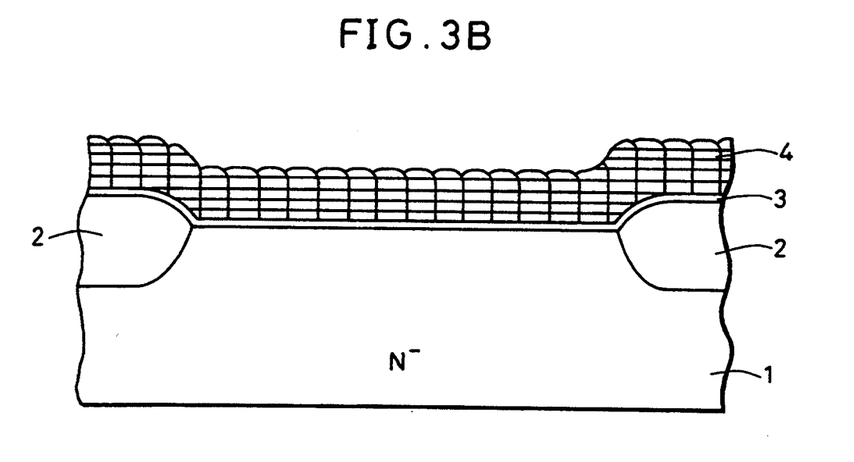
Figure 3C:
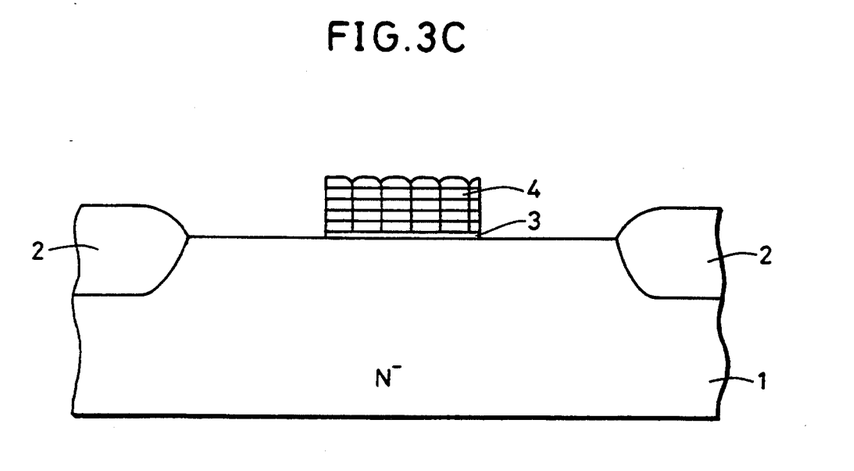
Figure 3D:
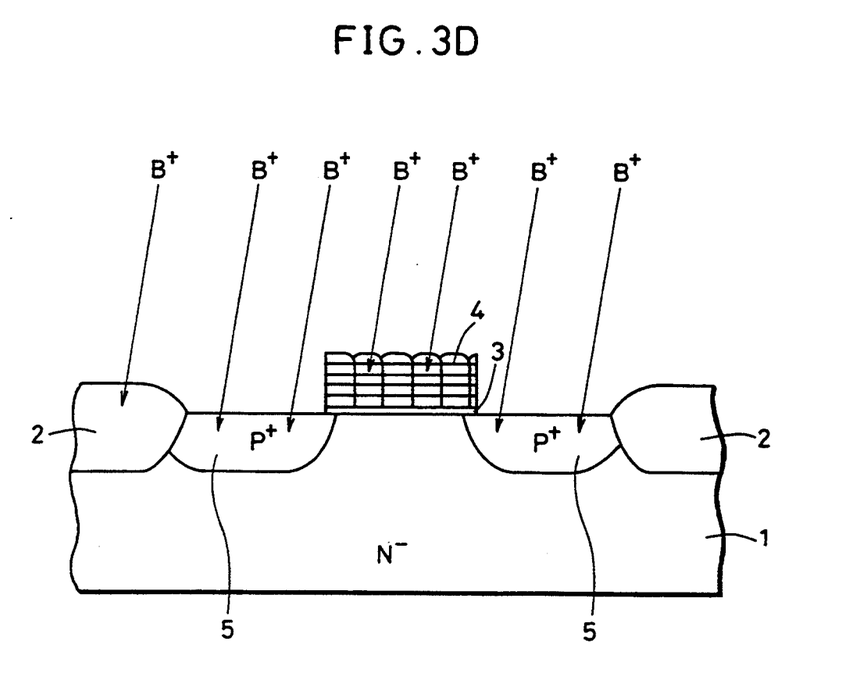

The manufacturing process will be explained hereinafter with reference to FIGS. 3A–3D. Element isolation oxide films 2 are formed on N type silicon substrate 1 with a predetermined distance therebetween for element isolation. Gate oxide film 3 is formed on N type silicon substrate 1 and element isolation oxide film 2. Referring to FIG. 3B, phosphorus is doped above gate oxide film 3 using low pressure CVD method to form a polycrystal silicon layer 4 having the crystal orientation arranged in a definite direction. The manner of arranging the crystal orientation of polycrystal silicon layer 4 will be explained afterwards. Referring to FIG. 3C, polycrystal silicon layer 4 and gate oxide film 3 are patterned by plasma etching using a resist pattern (not shown). Thus, a gate electrode having the structure of the present embodiment is obtained. Referring to FIG. 3D, p+impurity regions 5 are formed in self-alignment by implanting B+ions using polycrystal silicon layer 4 which becomes a gate electrode as a mask. The angle of implanting B+ions is a predetermined angle with respect to the crystal orientation of polycrystal silicon layer 4, where channeling phenomenon is substantially suppressed.

Figure 4A:
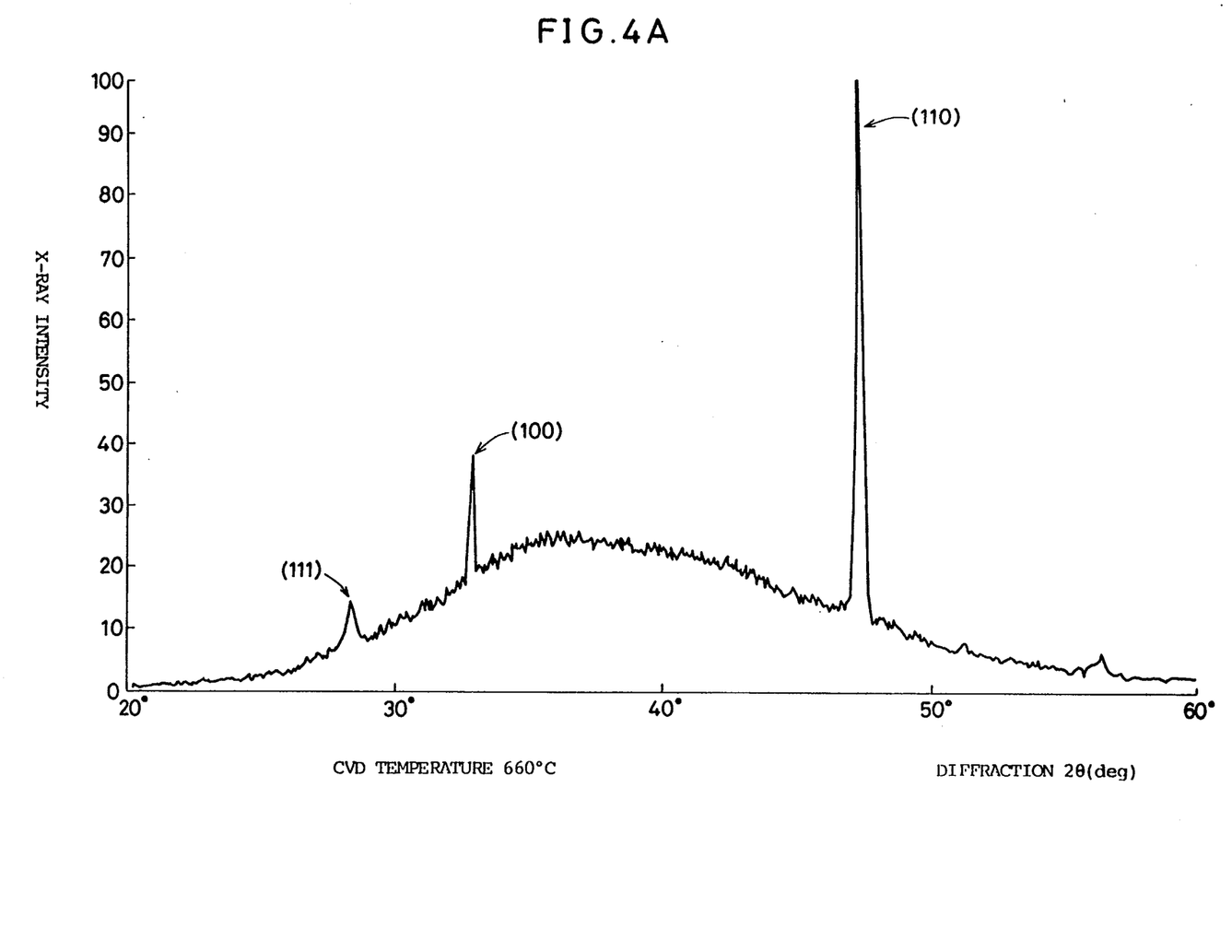
FIGS 4A–4D are graphs indicating the X-ray diffraction of the crystal orientation of a polycrystal silicon layer varying in temperature, at the step of forming a polycrystal silicon layer by low pressure CVD method.

It is necessary to carry out the formation by a low pressure CVD method with the following conditions to arrange the crystal orientation of polycrystal silicon layer 4 in a plane orientation of (110). It is desirable to use 100% silane or 20–30% silane in nitrogen as reaction gas under the conditions of atmospheric pressure of 0.1–1.0 Torr and atmospheric temperature of 550°C.–620° C. More preferably, the atmospheric pressure is 0.17 Torr, and the atmospheric temperature is 620° C. using 100% silane as reaction gas. The temperature condition is based on the following experimental results. The graphs of FIGS. 4A–4D have an abscissa indicating the diffraction angle, and an ordinate indicating the X-ray intensity. It can be understood from FIG. 4A that the crystal orientation of the polycrystal silicon layer is formed of two types of crystal grains having plane orientations of (110) and (111), when the polycrystal silicon layer is formed under a CVD temperature (atmospheric temperature) of 660° C. The peak of plane orientation (100) represents the crystal orientation of N type silicon substrate 1 in the graph. When the CVD temperature is 660° C., it is difficult to arrange the crystal orientation in a definite direction since the crystal grains of the formed polycrystal silicon layer has two plane orientations of (110) and (111).

Figure 4B:
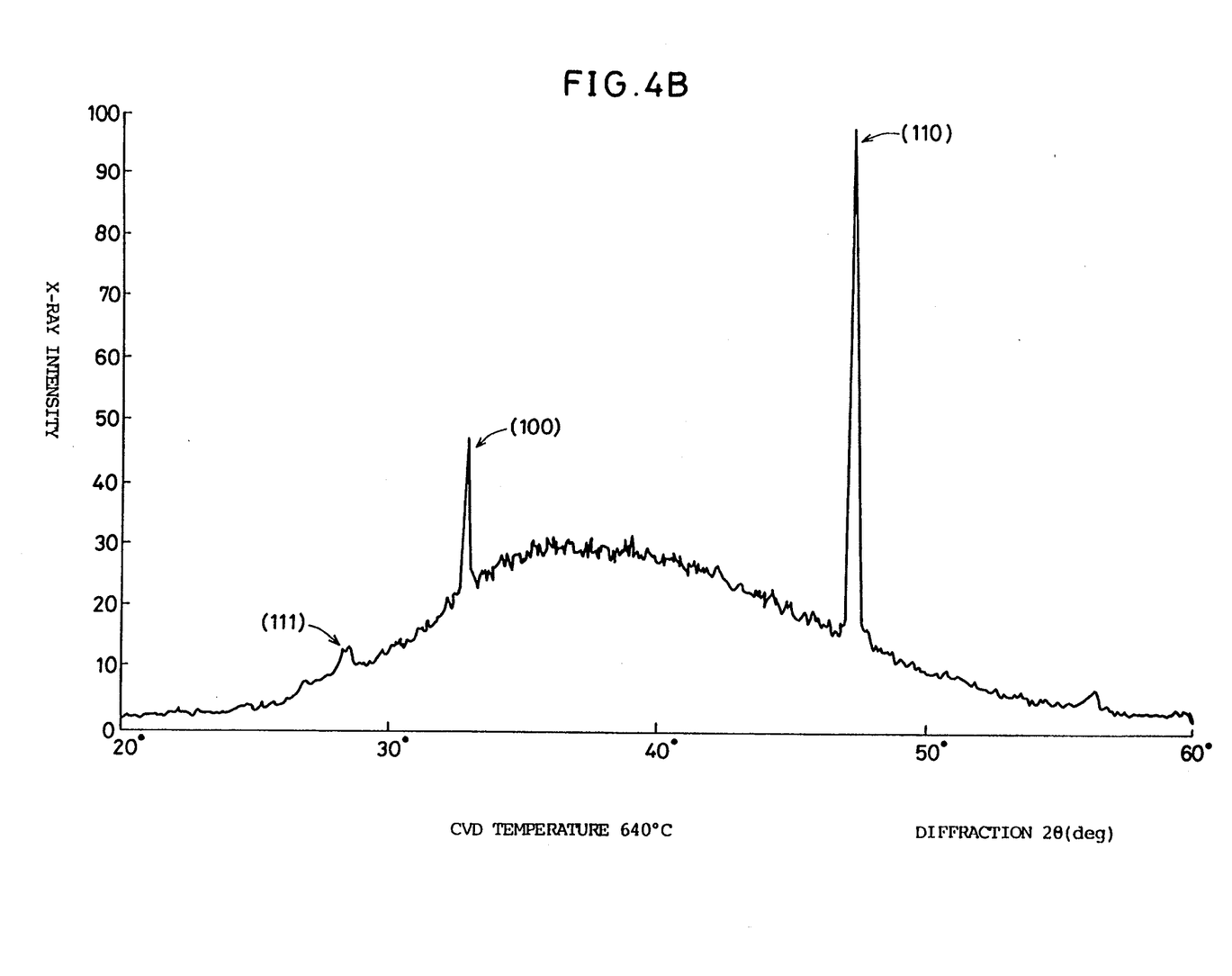

FIG. 4B shows the case where the polycrystal silicon layer 4 is formed at a CVD temperature (atmospheric temperature) of 640° C. It can be appreciated from the graph that the peak of plane orientation (111), although lower, is still present. It is therefore difficult to arrange the crystal orientation of the grains of polycrystal silicon layer 4 in a definite direction under this temperature condition.

Figure 4C:
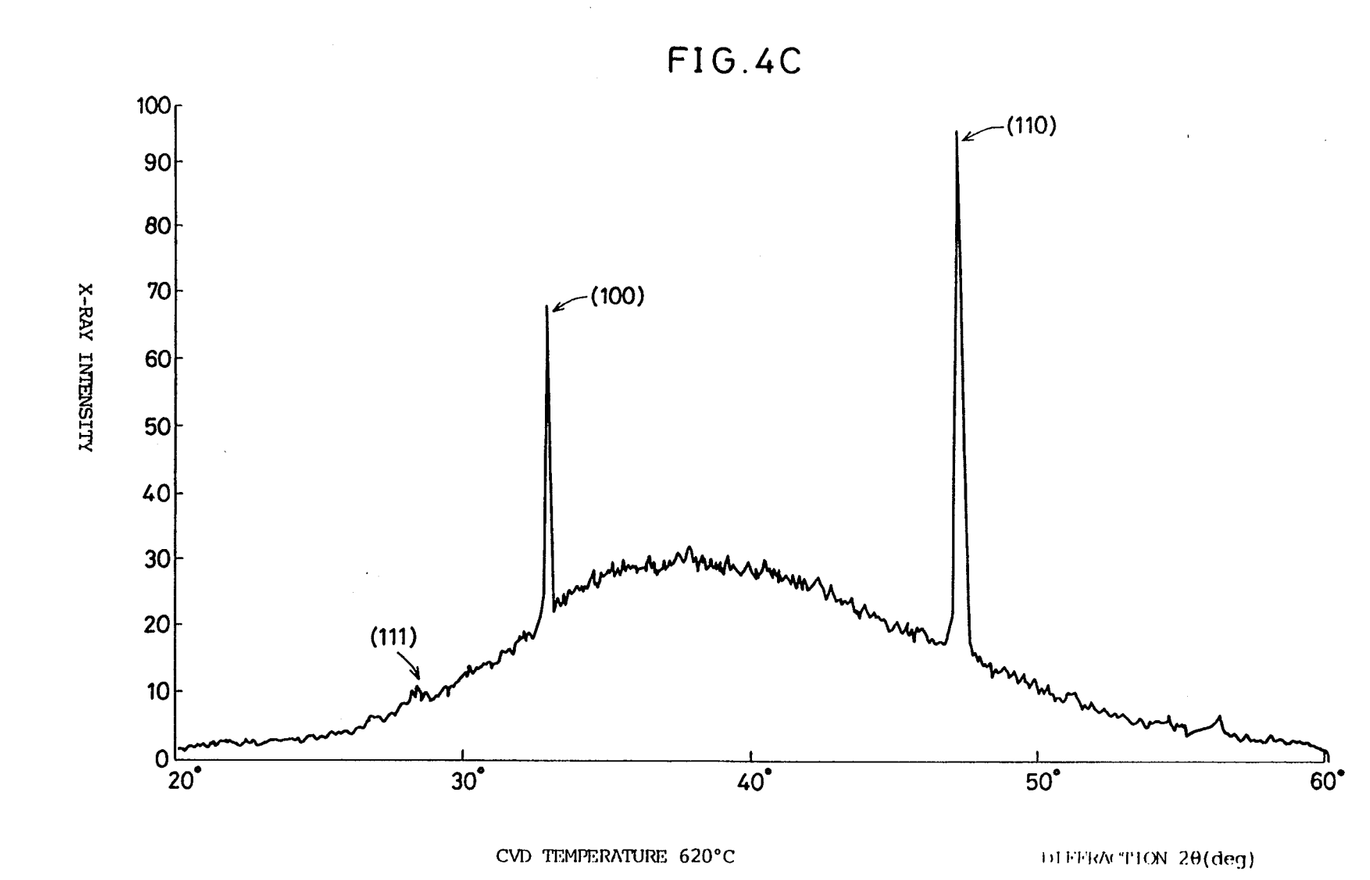

FIG. 4C shows a case where polycrystal silicon layer 4 is formed at a CVD temperature (atmospheric temperature) of 620° C. It can be seem from the graph that the peak of plane orientation (111) exist to a very small extent, and only the peak of plane orientation (110) is significant. This means that the crystal orientation of the crystal grains of polycrystal silicon layer 4 can be arranged to a plane orientation of (110) by forming the polycrystal silicon layer at an atmospheric temperature of 620° C. Regarding the conditions other than the temperature, 100% silane or 20–30% silane in nitrogen is used as reaction gas, and atmospheric pressure is set to 0.1–1.0 Torr, as mentioned before.

It can be appreciated from the experiment in which the CVD temperature (atmospheric temperature) was gradually lowered that the crystal orientation of polycrystal silicon layer 4 is arranged to (110) when the temperature is lowered to 620° C. It is presumed that a similar effect can be obtained when the CVD temperature is less than 620° C.

Figure 4D:
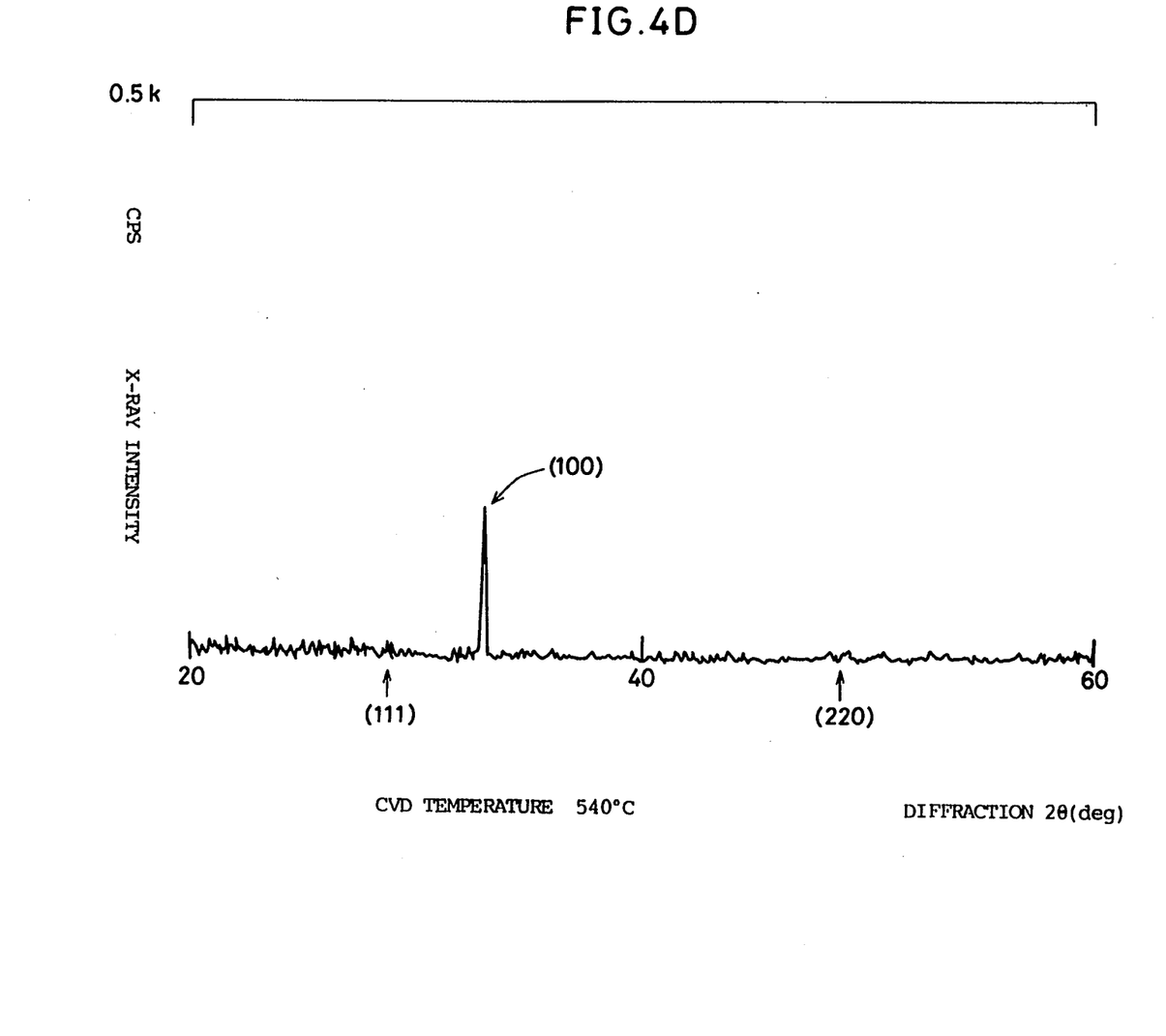

FIG. 4D shows the case where polycrystal silicon layer 4 is formed at a CVD temperature (atmospheric temperature) of 540° C. The crystal grains of polycrystal silicon layer 4 are amorphous, and the peak of the crystal orientation is not seen. That is to say, the peak value of the crystal orientation of polycrystal silicon layer 4 is not present since plane orientation (100) is the crystal orientation of N type silicon substrate 1. Therefore, it is difficult to arrange the crystal orientation of the polycrystal silicon layer in a definite direction when the CVD temperature is less than 540° C. It is therefore desirable to carry out the formation at a CVD temperature of above 550° C.

From the result of the experiment, it is appreciated that the formation must be carried out within the range of 550°C.–620° C. atmospheric temperature by low pressure CVD method to arrange the crystal orientation of polycrystal silicon layer 4 in a definite direction.

Figure 5:
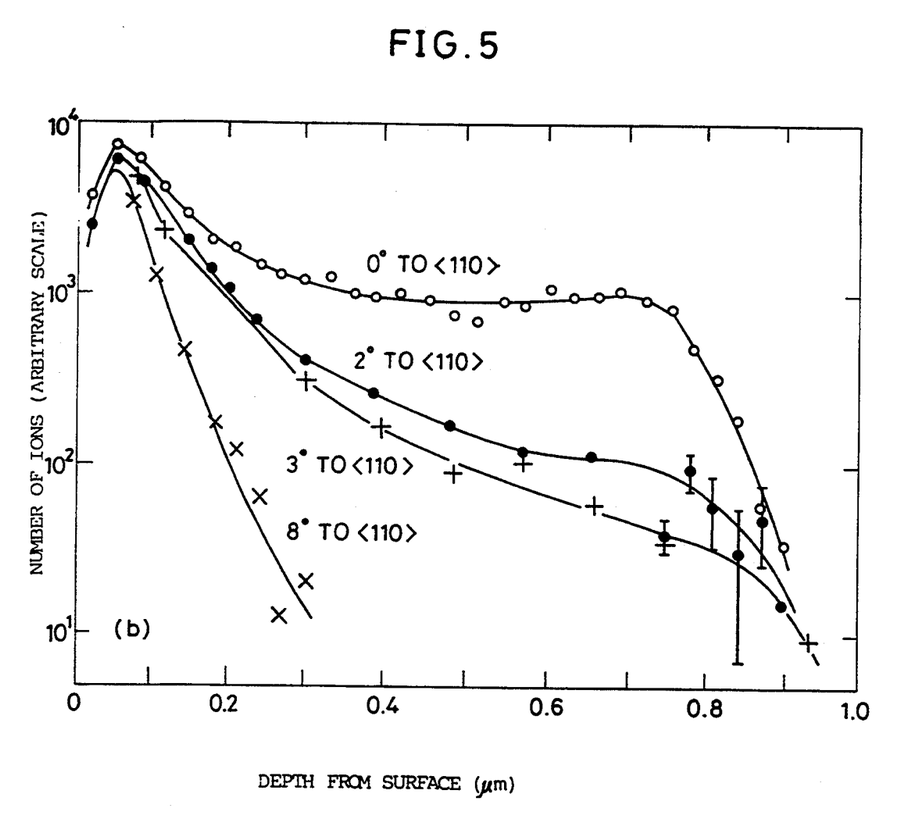
FIG. 5 is a graph showing the relation between the ion implantation angle and the ion implantation depth with respect to the crystallographic axis orientation of the crystal grains where the plane orientation is (110).

The implantation angle of B+ion will be explained hereinafter of the formation step of p+impurity region 5 of FIG. 3D. The graph of FIG. 5 is shown in chapter 5, 5.3, FIG. 5.8, *MOS LSI Manufacturing Technology*, Nikkei Mcgrow-Hill. The abscissa of the graph represents the depth from the surface, and the ordinate is the number of ions. This graph shows the result of an experiment carrying out ion implantation at an implantation angle within the range of 0°–8° with respect to the orientation of the crystallographic axis. It can be appreciated from FIG. 5 that the ion implantation depth takes a smallest value when implanted at an angle of 8° with respect to the crystallographic axis orientation of <110>. This means that channeling is least likely to occur when ions are implanted from an angle of 8° with respect to the crystallographic axis orientation of <110>. It is therefore desirable to implant ions at an angle of 8° with respect to the orientation of the crystallographic axis of the polycrystal silicon layer in the implantation step of FIG. 3D.

Figure 6:
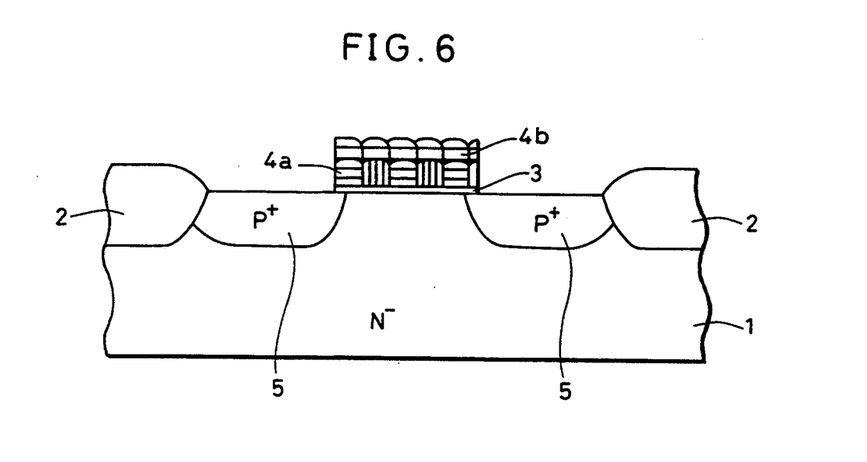
FIG. 6 is a sectional view of a P channel MOS transistor having a gate electrode according to another embodiment of the present invention.

FIG. 6 is a sectional view of a p channel MOS transistor having a gate electrode according to another embodiment of the present invention.

Referring to FIG. 6, this embodiment has the gate electrode formed by a two layered structure of a polycrystal silicon layer 4a and a polycrystal silicon layer 4b. Polycrystal silicon layer 4a is formed of polycrystal grains having a plurality of orientations, similar to that of a conventional polycrystal silicon layer 14 of FIG. 7. Polycrystal silicon layer 4b has the crystal orientation of the crystal grains arranged in a definite direction. An effect similar to that of the embodiment of FIG. 1 can be obtained by forming a gate electrode having a two layered structure of polycrystal silicon layers 4a and 4b, wherein one of the polycrystal silicon layers has the crystal orientation arranged in a definite direction.

Although the present embodiment is applied to a P channel MOS transistor, the present invention is not limited to this and can obtain a similar effect in an N channel MOS transistor application. Furthermore, the present invention is not limited to the present embodiment where the plane orientation of the crystal grains of polycrystal silicon layer 4 is arranged in (110), and can be arranged in a plane orientation of (111). More specifically, it is possible to form a polycrystal silicon layer having a plane orientation of (111) by controlling the CVD temperature (atmospheric temperature) condition.

According to an aspect of the present invention, there is provided a semiconductor device including a gate electrode having a polycrystal layer in which the crystal orientation of the crystal grains is arranged in a definite orientation. This effectively prevents ions from passing through locally a gate electrode to be implanted right beneath the gate electrode, by implanting ions at a predetermined angle with respect to the crystal orientation of the polycrystal layer. As a result, generation of erroneous operation and deterioration of the characteristic of the transistor can be effectively prevented, in forming an impurity region in self-alignment by ion implantation using a gate electrode as a mask.

According to another aspect of the present invention, there is provided a method of manufacturing a semiconductor device including the step of forming a polycrystal layer on a semiconductor substrate so that the crystal orientation of the crystal grains is arranged in a definite orientation. Then, the polycrystal layer is patterned. Using the patterned polycrystal layer as a mask, an impurity region is formed on the semiconductor substrate by implanting ions at a predetermined angle with respect to the crystal orientation of the polycrystal layer. This effectively prevents channeling phenomenon where ions pass through locally the gate electrode to be implanted right beneath the gate electrode at the time of ion implantation. As a result, generation of erroneous operation and deterioration of the characteristic of a transistor can be effectively prevented, in forming an impurity region in self-alignment by ion implantation using a gate electrode as a mask. The manufacturing process is not complicated because a polycrystal silicon layer having the crystal orientation arranged in a definite direction is formed with the number of processing steps identical to that of a conventional case.

According to a further aspect of the present invention, there is provided a method of manufacturing a polycrystal silicon layer including the step of forming a polycrystal silicon layer on an underlying substrate by chemical vapor deposition method using silane type gas as reaction gas under the conditions of atmospheric pressure of 0.1–1.0 Torr and an atmospheric temperature of 550°C.–620° C., so that the crystal orientation of the crystal grains is arranged in a definite direction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate of a first conductivity type;
    a pair of impurity regions of a second conductivity type formed with a predetermined distance therebetween on said semiconductor substrate; and
    a gate electrode formed on said semiconductor substrate between said pair of impurity regions, with an insulating film thereunder;
    wherein said gate electrode includes a first layer of polycrystalline material having crystal orientations of (110) and (111) on said insulating layer, and a second layer of polycrystalline material formed of a plurality of crystal grains which generally having planar orientation (110) on said first polycrystalline layer.

* * * * *